United States Patent
Ueno

(10) Patent No.: US 7,672,169 B2
(45) Date of Patent: Mar. 2, 2010

(54) NONVOLATILE SEMICONDUCTOR MEMORY AND DRIVING METHOD THEREOF

(75) Inventor: Koki Ueno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 164 days.

(21) Appl. No.: 12/033,453

(22) Filed: Feb. 19, 2008

(65) Prior Publication Data

US 2008/0198668 A1 Aug. 21, 2008

(30) Foreign Application Priority Data

Feb. 20, 2007 (JP) ............................. 2007-039758

(51) Int. Cl.
*G11C 16/06* (2006.01)
(52) U.S. Cl. .............................. 365/185.25; 365/185.27
(58) Field of Classification Search ............ 365/185.25, 365/185.27, 185.23
See application file for complete search history.

(56) References Cited

U.S. PATENT DOCUMENTS

| | | | | |
|---|---|---|---|---|
| 5,894,435 A | * | 4/1999 | Nobukata | ............. 365/185.03 |
| 6,081,455 A | * | 6/2000 | Le et al. | ................. 365/185.23 |
| 6,614,688 B2 | * | 9/2003 | Jeong et al. | ............. 365/185.18 |
| 7,196,933 B2 | | 3/2007 | Shibata | |
| 7,310,269 B2 | | 12/2007 | Shibata | |
| 2008/0094903 A1 | * | 4/2008 | Maejima et al. | ......... 365/185.17 |

FOREIGN PATENT DOCUMENTS

| | | |
|---|---|---|
| JP | 2000-269364 | 9/2000 |
| JP | 2006-172523 | 6/2006 |

* cited by examiner

*Primary Examiner*—Anh Phung
(74) *Attorney, Agent, or Firm*—Oblon, Spivak, McClelland, Maier & Neustadt, L.L.P.

(57) ABSTRACT

A nonvolatile semiconductor memory according to an aspect of the invention comprises a plurality of serially connected memory cells arranged on a P-well area within a semiconductor substrate, select gate transistors connected to one end and the other of the serially connected memory cells, a P-well control circuit which controls the P-well area, a plurality of word lines connected to the plurality of memory cells, a row control circuit which controls the plurality of word lines, and an operation control circuit which controls the P-well control circuit and the row control circuit, wherein, when writing to a selected one of the plurality of memory cells, the operation control circuit controls the P-well control circuit to apply a precharge potential to the P-well area and thus precharge channel areas of the plurality of memory cells.

20 Claims, 7 Drawing Sheets

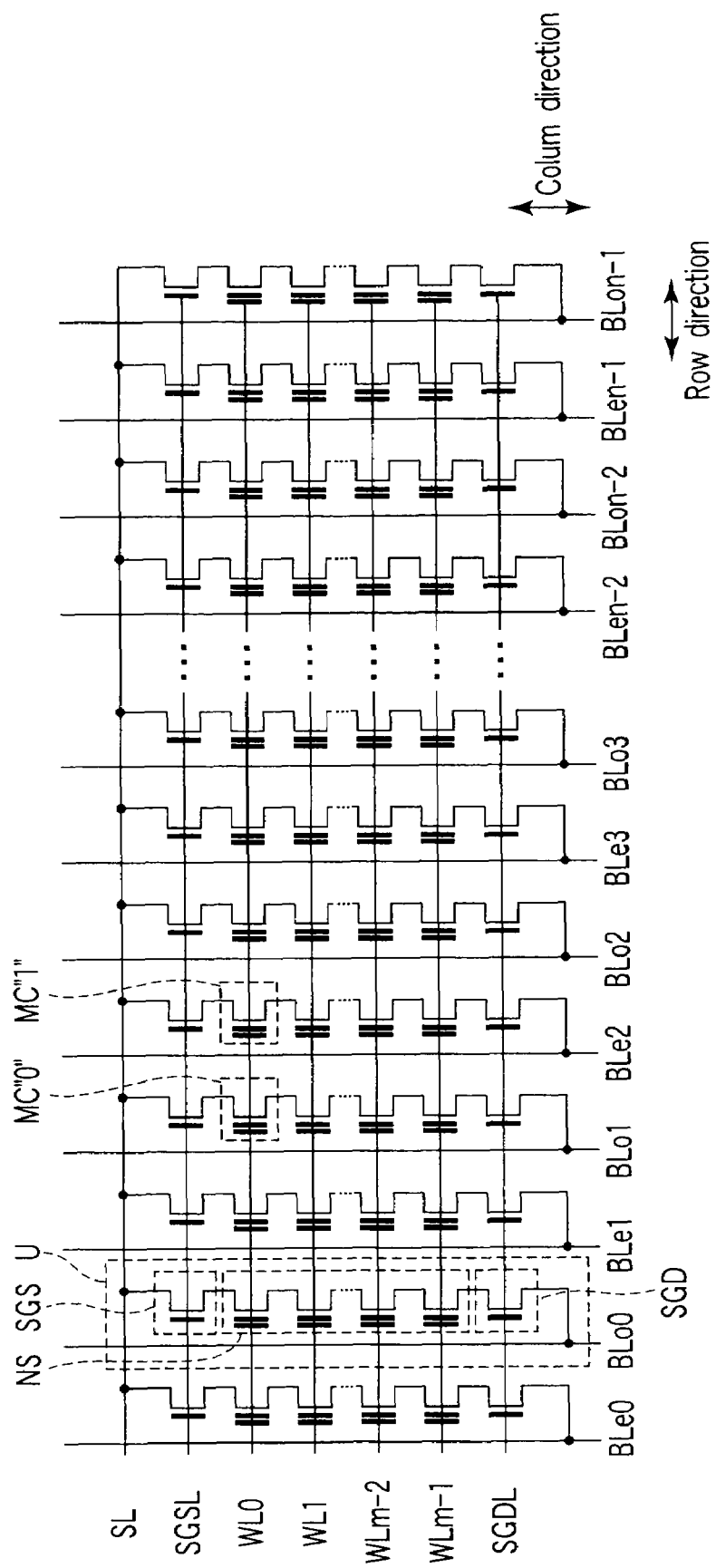
F I G. 3

NONVOLATILE SEMICONDUCTOR MEMORY AND DRIVING METHOD THEREOF

CROSS-REFERENCE TO RELATED APPLICATIONS

This application is based upon and claims the benefit of priority from prior Japanese Patent Application No. 2007-039758, filed Feb. 20, 2007, the entire contents of which are incorporated herein by reference.

BACKGROUND OF THE INVENTION

1. Field of the Invention

The present invention relates to a nonvolatile semiconductor memory, and more particularly, it relates to a flash memory. The present invention also relates to a driving method thereof.

2. Description of the Related Art

Recently, nonvolatile semiconductor memories, for example, flash memories have been in wide use as storages for electronic devices.

In a NAND flash memory, a plurality of NAND cell units are arranged in a memory cell array. One NAND cell unit is composed of a plurality of memory cells serially connected in a column direction, and select gate transistors connected to one end (source side) and the other (drain side) of the plurality of memory cells. Then, a plurality of NAND cell units are adjacently arranged in a row direction. Further, a plurality of memory cells adjacent to one another in a row direction are connected to one common word line, and a bit line is connected to a drain diffusion layer of the drain side select gate transistor. A potential is applied to the bit line and the word line, such that the writing or reading operation of the memory cell is executed.

As the plurality of memory cells are connected to the common selected one word line, this word line has, in writing, memory cells which are selected and into which data is written (hereinafter referred to as "0" programming cells) and memory cells into which no data should be written (hereinafter referred to as "1" programming cells). Therefore, there has been employed a technique for boosting up channel areas of the "1" programming cells in order to prevent erroneous writing (e.g., refer to U.S. Pat. No. 7,196,933).

In boosting up the channel areas of the memory cells, a precharge potential is first transferred from the bit line to the channel areas of the memory cells. Then, a high potential is applied to selected word lines and nonselected word lines, and the channel areas of the memory cells are boosted up. At this point, if the transferred precharge potential is low, the "1" programming cells are not sufficiently boosted up, leading to an increased possibility of erroneous writing.

The transferred precharge potential is substantially equal to the subtraction of a threshold potential of the select gate transistor from its gate potential. That is, the magnitude of the transferable precharge potential is determined by the gate withstand potential of the drain side select gate transistor of the NAND cell unit.

Furthermore, when there is, between the drain side select gate transistor and the "1" programming cell, a memory cell into which data is already written and which thus has an increased threshold potential, the transferred precharge potential decreases due to this memory cell.

Therefore, the channel areas of the cells not selected for writing are insufficiently boosted up, which might lead to erroneous writing.

BRIEF SUMMARY OF THE INVENTION

A nonvolatile semiconductor memory according to an example of the present invention comprises: a plurality of serially connected memory cells arranged on a P-well area within a semiconductor substrate; select gate transistors connected to one end and the other of the serially connected memory cells; a P-well control circuit which controls the P-well area; a plurality of word lines connected to the plurality of memory cells; a row control circuit which controls the plurality of word lines; and an operation control circuit which controls the P-well control circuit and the row control circuit, wherein, when writing to a selected one of the plurality of memory cells, the operation control circuit controls the P-well control circuit to apply a precharge potential to the P-well area and thus precharge channel areas of the plurality of memory cells.

A nonvolatile semiconductor memory according to an example of the present invention comprises: a plurality of serially connected memory cells arranged on a P-well area within a semiconductor substrate; select gate transistors connected to one end and the other of the serially connected memory cells; a P-well control circuit which controls the P-well area; a plurality of word lines connected to the plurality of memory cells; a row control circuit which controls the plurality of word lines; and an operation control circuit which controls the P-well control circuit and the row control circuit, wherein, when writing to a selected one of the plurality of memory cells, the operation control circuit controls the row control circuit to bring the select gate transistors at the one end and the other into a floating state, and the operation control circuit then controls the P-well control circuit to apply a precharge potential to the P-well area and thus precharge channel areas of the plurality of memory cells.

A driving method of a nonvolatile semiconductor memory according to an example of the present invention comprises: applying a precharge potential to a P-well area within a semiconductor substrate in which a plurality of memory cells are provided; applying a potential to a plurality of word lines connected to the plurality of memory cells; stopping the application of the precharge potential to the P-well area after the application of the potential to the plurality of word lines; and applying a program potential to a selected one of the plurality of word lines after stopping the application of the precharge potential.

BRIEF DESCRIPTION OF THE SEVERAL VIEWS OF THE DRAWING

FIG. 3 is an equivalent circuit diagram showing circuit configurations in a block;

DETAILED DESCRIPTION OF THE INVENTION

Several modes for carrying out examples of the present invention will hereinafter be described in detail with reference to the drawings.

1. Outline

Embodiments of the present invention are characterized in that a precharge potential for boost-up is applied from a P-well area when channel areas of memory cells are boosted up. This permits, for example, a potential as high as a read potential to be used as the precharge potential without being limited by the gate withstand potential of a select gate transistor, in contrast with the case where the precharge potential is applied from a bit line as has heretofore been done.

Furthermore, the precharge potential is collectively applied to the channel areas of all the memory cells arranged in the P-well area. Thus, the precharge potential can be applied to the channel areas of the memory cells without being affected by a back pattern (adjacent cells) of, for example, a memory cell into which "0" has been written and which thus has an increased threshold potential, in contrast with the case where the precharge potential is sequentially transferred from bit line side memory cells to source line side memory cells and applied to the respective channel areas as has heretofore been done.

Therefore, the occurrence of erroneous writing to "1" programming cells can be inhibited.

2. EMBODIMENTS (1) First Embodiment (a) Circuit Configuration

Figure 1:
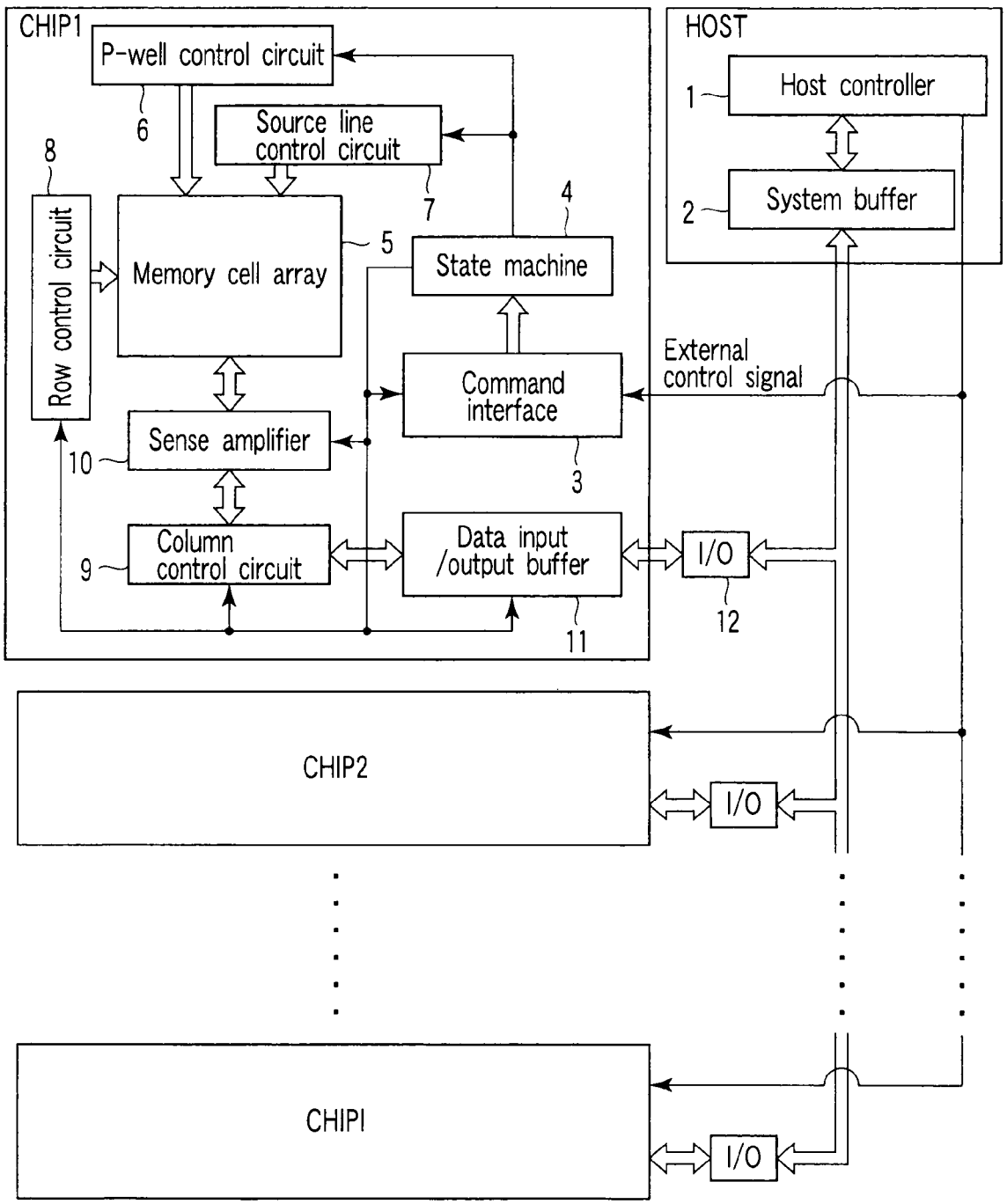
FIG. 1 is a block diagram showing a memory core part of a flash memory.

FIG. 1 is a block diagram showing a memory core part of a flash memory.

As shown in FIG. 1, a host controller 1 and a system buffer 2 are provided in a host unit HOST. The one host controller 1 transmits an external control signal to a plurality of memory chips CHIP1 to CHIPl. Further, data input/output between the host controller 1 and the memory chips CHIP1 to CHIPl is transmitted/received via the system buffer 2 and an external I/O pad 12.

The plurality of memory chips CHIP1 to CHIPl are flash memories of the same circuit configuration. Thus, the circuit configuration of the memory chip CHIP1 is explained below as an example.

The external control signal output from the host controller 1 is input to a state machine (operation control circuit) 4 via a command interface 3.

The state machine 4 determines the operation mode (e.g., write, erase, read) of the memory chip CHIP1 on the basis of the external control signal. Then, in accordance with the operation mode, the state machine 4 controls the operations of a P-well control circuit 6, a source line control circuit 7, a row control circuit 8, a column control circuit 9 and a sense amplifier 10.

In accordance with such operations, the P-well control circuit 6 controls the potentials of a plurality of P-well areas corresponding to a plurality of blocks constituting a memory cell array 5.

Furthermore, the source line control circuit 7 controls the potential of a source line provided in the memory cell array 5.

The row control circuit 8 is composed of a row address decoder and a word line driver. The row control circuit 8 controls the potentials of a plurality of word lines and select gate lines in the memory cell array 5 on the basis of the operation mode and an address specified by a row address signal.

The column control circuit 9 selects a bit line in the memory cell array 5 on the basis of a column address signal.

On the basis of the address selected by the row control circuit 8 and the column control circuit 9, write data or read data is input to/output from the memory cell array 5 via the sense amplifier 10 and a data input/output buffer 11.

Figure 2:
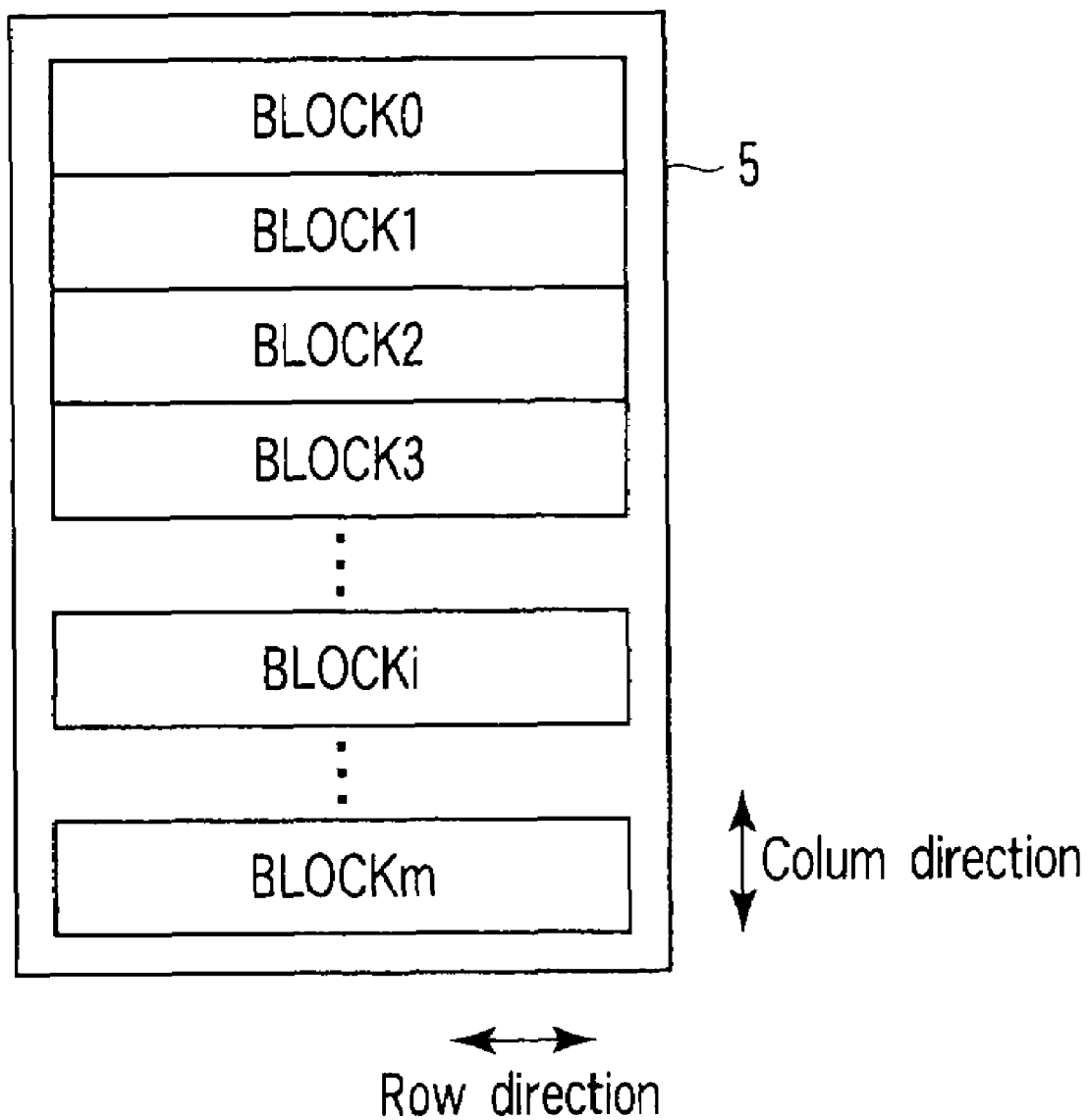
FIG. 2 is a layout diagram showing the structure of a memory cell array.

FIG. 2 shows the internal configuration of the memory cell array 5. FIG. 3 shows a circuit example of one of a plurality of blocks shown in FIG. 2. The memory cell array 5 is composed of a plurality of blocks BLOCK1 to BLOCKm. The plurality of blocks BLOCK1 to BLOCKm are arranged side by side in a column direction.

As shown in FIG. 3, one block is composed of a plurality of NAND cell units U arranged in a row direction. One NAND cell unit U is composed of a NAND string NS including a plurality of serially connected memory cells, a select gate transistor (second select gate transistor) SGD connected to one end (drain side) of the NAND string NS, and a select gate transistor (first select gate transistor) SGS connected to the other end (source side) of the NAND string NS.

Bit lines BLe0 to BLen-1 or bit lines BLo0 to BLon-1 are connected to the drains of the select gate transistors SGD. The bit lines BLe0 to BLen-1 or bit lines BLo0 to BLon-1 are driven by, for example, a shield bit line method. That is, when the bit lines are counted from zero, the plurality of even bit lines BLe0, BLe1, . . . , BLen-1 from one end of the block and the plurality of odd bit lines BLo0, BLo1, . . . , BLon-1 from the one end are driven separately from each other.

A source line SL is connected to the sources of the select gate transistors SGS. Word lines WL0 to WLm-1 extend in the row direction, and the memory cells adjacent in the row direction are connected to the common word lines WL0 to WLm-1. For example, when "0" is written into a memory cell MC "0" connected to the word line WL0, a write potential (program potential) Vpgm (e.g., about 20V) is applied to the selected word line WL0. At this point, as the memory cells located adjacent in the row direction are connected to the common word line, the write potential is applied not only to the memory cell MC "0" selected for writing ("0" programming cell) but also to all the memory cells connected to the word line WL0, so that the memory cells are brought into an on-state.

Therefore, the channel areas of the memory cells MC "1" ("1" programming cells) which need no writing are boosted up to prevent erroneous writing.

In the present embodiment, for example, a read potential Vread (e.g., about 5V) is applied as a precharge potential to the P-well area in which the memory cells are arranged. Thus, the channel areas of the memory cells on the P-well area are precharged and then boosted up.

Thus, the precharge potential can be applied to the channel areas without being affected by the characteristics of the select gate transistor or by a back pattern in writing, and the occurrence of erroneous writing to the memory cells can be inhibited.

(b) Precharge Model

A precharge model of the channel areas in the embodiment of the present invention is explained below with FIG. 4.

Figure 4:
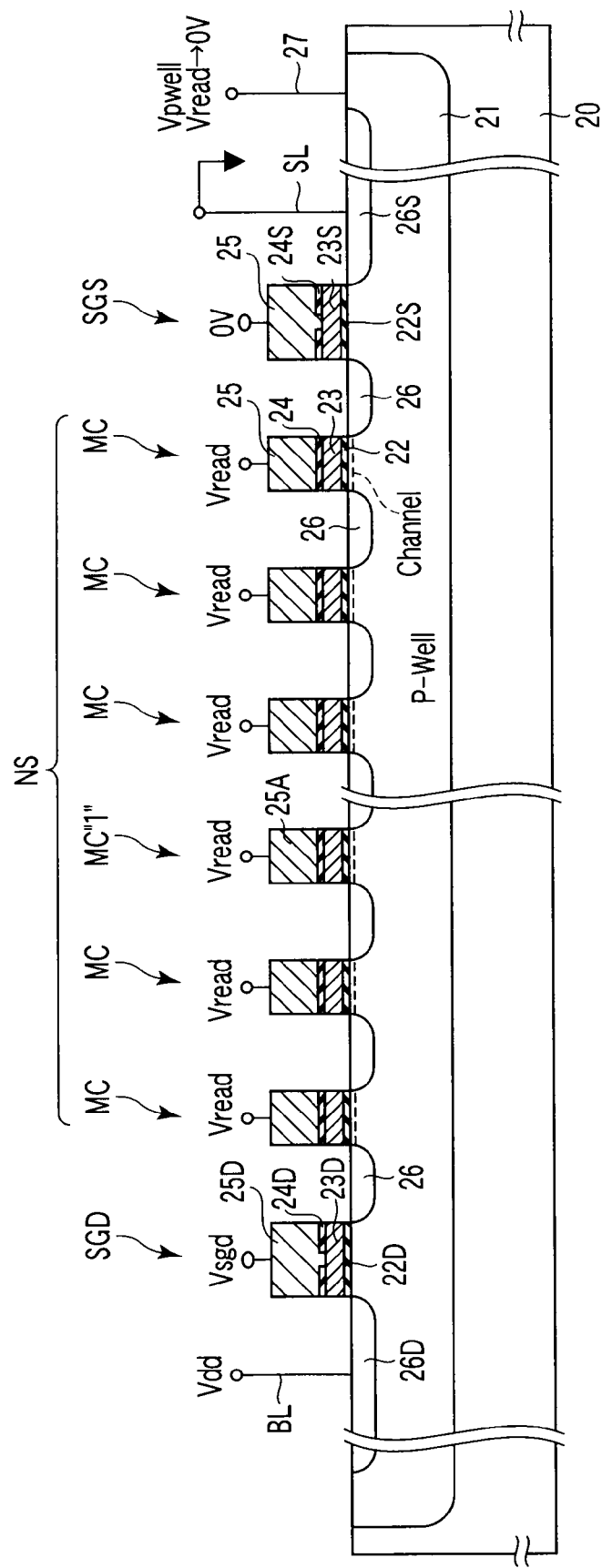
FIG. 4 is a sectional view showing a precharge model of a channel of a memory cell.

As shown in FIG. 4, a P-well area 21 is formed in a semiconductor substrate 20. In addition, a so-called double well structure is also possible in which an N-well area is further formed in the semiconductor substrate 20 to enclose the P-well area 21.

The NAND string NS is disposed on the P-well area 21. The select gate transistors SGD, SGS are arranged at one end and the other of the NAND string NS.

The plurality of memory cells MC, MC "1" constituting the NAND string NS have a stacked gate structure. The stacked gate is disposed on a channel area Channel between two source/drain diffusion layers 26. The source/drain diffusion layers 26 are n-type semiconductor layers.

A gate insulating film (tunnel oxide film) 22 is formed on the surface of the semiconductor substrate 20 on the channel area Channel. Then, a floating gate electrode 23 and control gate electrodes 25, 25A are stacked on the gate insulating film 22 via an intergate insulating film 24. The control gate electrodes 25, 25A function as, for example, word lines.

Furthermore, the select gate transistors SGD, SGS are formed in the same process as the memory cell MC. Therefore, the select gate transistors SGD, SGS also have stacked gate structures. The stacked gate has a structure in which a first gate electrode 23D, 23S and a second gate electrode 25D, 25S are stacked on a gate insulating film 22D, 22S via an intergate insulating film 24D, 24S. Moreover, the first gate electrode 23D, 23S is connected to the second gate electrode 25D, 25S via an opening formed in the intergate insulating film 24D, 24S.

Then, the bit line BL is connected to a drain diffusion layer 26D of the select gate transistor SGD, and the source line SL is connected to a source diffusion layer 26S of the select gate transistor SGS. Moreover, a terminal 27 for applying a P-well potential Vpwell is provided in the P-well area 21.

A case will be described below where the control gate electrode 25A serves as a selected word line and the memory cell MC "1" is a "1" programming cell.

In the present embodiment, a precharge potential is applied to the P-well area 21 in order to precharge the channel areas of the memory cells. The magnitude of the precharge potential is substantially equal to, for example, the read potential Vread (e.g., about 5V). At the same time, a potential substantially equal to the precharge potential, that is, the read potential Vread is also applied to the selected word line (control gate electrode 25A) and the nonselected word lines (control gate electrodes 25).

As the source/drain diffusion layer 26 of the memory cell MC "1", MC is an n-type semiconductor layer, a p-n junction is formed between the source/drain diffusion layer 26 and the P-well area 21 which is a p-type semiconductor layer.

When the read potential Vread is applied to the P-well area 21, a forward bias potential difference is applied across the source/drain diffusion layer 26 and the P-well area 21, so that the source/drain diffusion layer 26 is charged substantially to the read potential Vread. The channel area Channel of the memory cell MC "1", MC is also charged substantially to the read potential Vread accordingly.

Subsequently, the potential applied to the P-well area 21 is brought to zero, but the read potential Vread is applied to the word line (control gate electrode 25, 25A), and the channel area Channel of the memory cell is kept charged.

Therefore, an inversion layer remains formed in the channel area Channel of the memory cell MC "1", MC, and the channel area Channel is precharged substantially to the read potential Vread.

As described above, the select gate transistor SGD is formed in the same process as the memory cell. The select gate transistor SGD is designed to have, for example, a gate size wider than the memory cell in order to increase its withstand potential, but the thickness of its gate insulating film 22D is the same as that of the tunnel oxide film 22 of the memory cell. Therefore, there is a limit in its withstand potential, so that a sufficiently high potential cannot be applied to the gate electrodes 23D, 25D. Thus, when the channel areas of the memory cells are precharged from the side of the bit line BL as has heretofore been done, a transferable precharge potential can only apply a potential substantially equal to the subtraction of a threshold potential Vth of the select gate transistor SGD from its gate potential Vsgd. In conventional methods, a transferable precharge potential is about 1 to 1.5V if the threshold potential (e.g., 1.5V) of the select gate transistor SGD is subtracted from a potential (e.g., 2.5V) applied to the bit line BL, for example, in the case where the gate potential Vsgd of the select gate transistor SGD is about 4V.

However, in the present embodiment, the precharge potential can be directly applied to the channel area Channel of the memory cell with no passage through the select gate transistor SGD. Thus, a high potential can be applied to the channel area Channel from the P-well area 21 without being affected by the gate withstand potential of the select gate transistor SGD. Therefore, a high potential, for example, a read potential Vread of about 5V can be used for the precharge potential.

Furthermore, when there is a memory cell into which "0" has been written among memory cells between the bit line BL and the source line SL, the threshold potential of this memory cell has increased.

In the case where the precharge potential is transferred from the bit line BL side to the source line SL side as has heretofore been done, if there is a "0" programming cell on the side closer to the bit line BL than the memory cell MC "1", the precharge potential transferred to the memory cells located closer to the source line SL than the "0" programming cell decreases due to the threshold potential of the "0" programming cell. Therefore, the channel areas of these memory cells are not sufficiently precharged.

However, in the present embodiment, the precharge potential is applied to the P-well area 21. Thus, the channel areas of all the memory cells on the P-well area are collectively precharged from the side of the P-well area 21 with no passage through the memory cell having a high threshold potential.

Consequently, according to the present embodiment, a sufficiently high precharge potential can be applied to the channel areas of the memory cells without being affected by the characteristics of the select gate transistor or by the adjacent memory cells.

It is therefore possible to provide a highly reliable NAND type flash memory which can prevent erroneous writing to the "1" programming cells.

In addition, the embodiments of the present invention are characterized in that the precharge potential for the channel areas of the memory cells is applied from the P-well area, and this can be achieved without modifying the structures of the conventional memory cells and select gate transistors.

(c) Operation

The operation in the first embodiment is explained below with FIGS. 1, 5 and 6.

Figure 5:
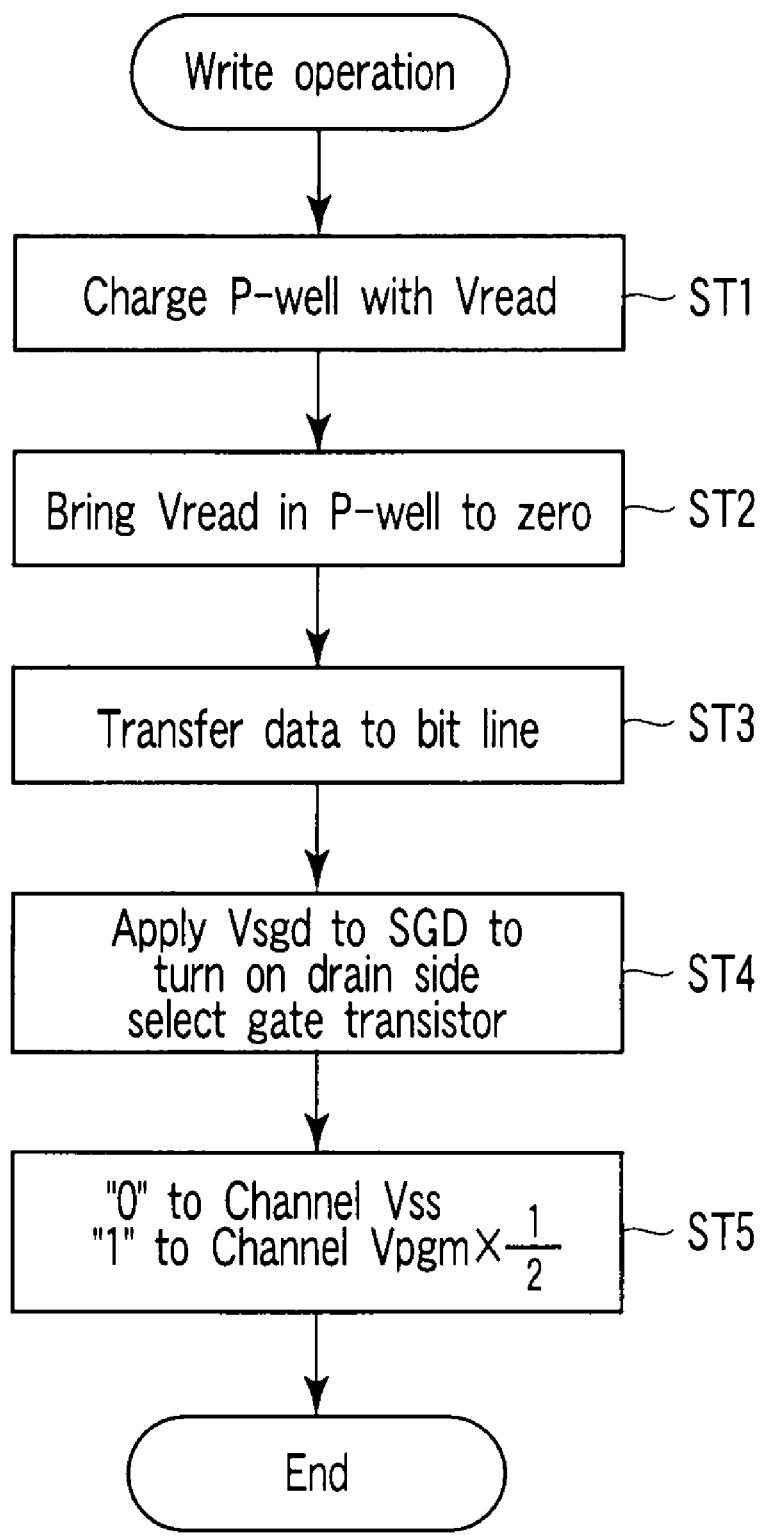
FIG. 5 is a step diagram showing the operation in a first embodiment.

FIG. 5 is a step diagram showing the operation in the present embodiment. FIG. 6 is a diagram showing a timing chart of the operation in the present embodiment.

As described above, the potential applied to the P-well area is applied by the P-well control circuit 6 shown in FIG. 1. The P-well control circuit 6 is controlled by the state machine (operation control circuit) 4.

Figure 6:
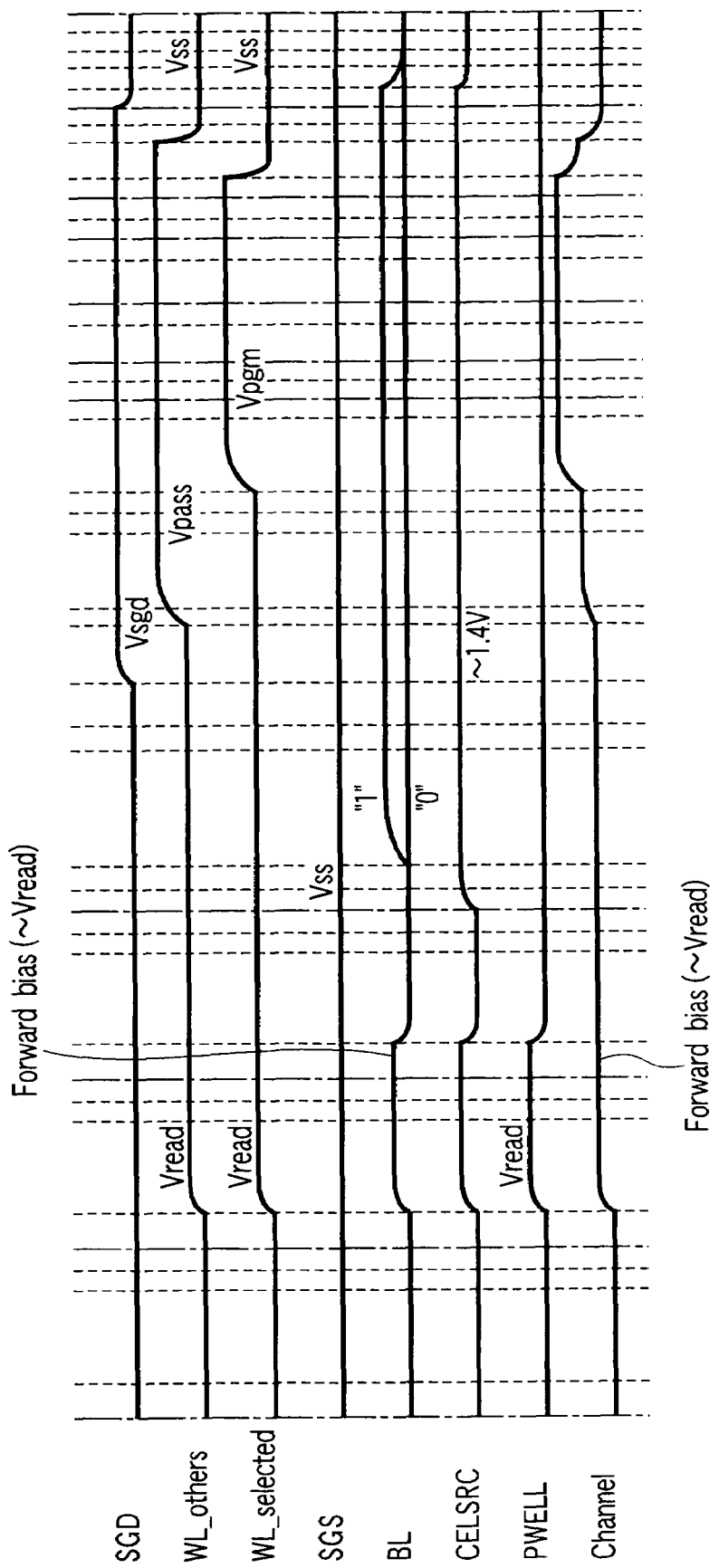
FIG. 6 is a timing chart showing a write operation in the first embodiment.

First, as shown in FIGS. 5 and 6, the state machine 4 in FIG. 1 causes the P-well control circuit 6 to apply the precharge potential to a P-well area PWELL (ST1). The precharge potential is substantially equal to, for example, the read potential Vread (e.g., about 5V). At the same time, the state machine 4 causes the row control circuit 8 to apply a potential to a selected word line WL_selected and nonselected word lines WL_Others. The magnitude of the potential applied to the selected word line WL_selected and the nonselected word lines WL_Others is equal to, for example, that of the precharge potential (read potential). This brings the memory cells into an on-state, and an inversion layer is formed. At this point, the select gate transistors SGD, SGS are, for example, in an off-state.

Then, the source/drain diffusion layer of the memory cell is charged to a forward bias potential Vforward (about Vread), and as shown in FIG. 6, the potential of the channel area Channel of the "1" programming cell rises to about the forward bias potential Vforward. At this point, a diffusion layer to which the bit line BL and a source line CELSRC are connected is also charged, and the potentials of the bit line BL and the source line CELSRC also rise to the forward bias potential Vforward. In addition, the potential of the channel area Channel applies a potential to the P-well area PWELL and, at the same time, is precharged to the forward bias potential Vforward, causing, for example, no time lag during a charge. Moreover, the time for applying the precharge potential to the P-well area can be controlled by the state machine 4 via the P-well control circuit 6. This allows the time for precharging to be optimized.

Next, the state machine 4 operates the P-well control circuit 6 so that the application of the potential to the P-well area PWELL is stopped (ST2). In addition, the selected word line WL_selected and the nonselected word lines WL_Others are kept at the read potential Vread.

This brings the potential of the P-well area PWELL to zero, as shown in FIG. 6. On the other hand, the read potential Vread is applied to the selected word line WL_selected and the nonselected word lines WL_Others, and the inversion layer is still formed. Therefore, the channel area Channel of the memory cell is precharged substantially with the forward bias potential Vforward, that is, the read potential Vread. At this point, the potentials of the bit line BL and the source line CELSRC short-circuit using the bit line BL and the source line CELSRC as ground points, thereby discharging the bit line and the source line.

After the precharge described above, a write operation is executed as in the conventional manner.

For example, the state machine 4 operates the source line control circuit 7 so that the potential of the source line CELSRC is, for example, about 1.4V.

Subsequently, the state machine 4 causes the column control circuit 9 and the sense amplifier 10 to transfer data (ST3). Thus, a zero potential is applied to the bit line to which the "0" programming cell is connected, and, for example, a power supply potential Vdd (e.g., about 2.5V) is applied to the bit line to which the "1" programming cell is connected.

Then, the state machine 4 causes the row control circuit 8 to apply the gate potential Vsgd (e.g., about 4V) to the select gate transistor SGD (ST4).

At this point, since the gate potential Vsgd is applied to the gate electrode (select gate line) of the select gate transistor SGD, a zero potential is applied from the bit line BL to the channel area of the "0" programming cell connected to the selected word line WL_selected, and the potential of this channel area reaches zero. Moreover, the "1" programming cell connected to the selected word line WL_selected is in a cut-off state because the power supply potential Vdd is applied to this "1" programming cell from the bit line to which this cell is connected. Thus, the forward bias potential Vforward, that is, the read potential Vread is maintained in the channel area of the "1" programming cell.

Subsequently, a midpoint potential Vpass (e.g., about 10V) is applied to the nonselected word lines WL_Others. Then, the write potential Vpgm (e.g., about 20V) is applied to the selected word line WL_selected. This boosts up the channel area of the "1" programming cell to, for example, about half of the write potential Vpgm. Therefore, no electric field necessary for writing "0" is applied across the control gate electrode and the channel area. Further, zero potential is applied to the "0" programming cell connected to the selected word line WL_selected, from the bit line BL to which this "0" programming cell is connected. Therefore, an electric field sufficient for writing "0" is applied across the control gate electrode and the channel area. Thus, "0" is programmed into the memory cell. In addition, the midpoint potential Vpass is a potential greater than zero V and less than the write potential Vpgm.

After "0" has been written, the potential of the selected word line WL_selected is brought to zero, and then the potentials of the nonselected word lines WL_Others are brought to zero, such that the write operation is completed.

As described above, the precharge potential for the channel area of the memory cell is applied from the P-well area. For example, a potential substantially equal to the read potential Vread (e.g., about 5V) is used for the precharge potential. Then, after precharged, the channel area is boosted up by the midpoint potential Vpass (e.g., about 10V) higher than its read potential.

In the present embodiment, the precharge potential is applied from the P-well area to the channel area. Therefore, the precharge potential enables a high potential to be applied to the channel area without being limited by the gate withstand potential of a drain side select gate transistor.

Furthermore, during the application of the precharge potential, the channel area can be precharged without being affected by a back pattern of, for example, a memory cell into which "0" has been written and which thus has an increased threshold potential.

It is therefore possible to provide a highly reliable NAND flash memory which can inhibit erroneous writing to the "1" programming cells.

In addition, the example of the present invention enables the channel area to be precharged from the P-well area without modifying conventional circuit configurations. It is therefore possible to provide a highly reliable NAND flash memory which can inhibit erroneous writing to the memory cells without increasing manufacturing costs.

(2) Second Embodiment

In the first embodiment, a precharge potential is set to a read potential, and the channel area of a memory cell is precharged by the precharge potential then the channel area is boosted up.

However, in the example of the present invention, the channel area is precharged by the application of the precharge potential from a P-well area with no passage through a select gate transistor. Therefore, a higher precharge potential can be applied to the channel area without being affected by the gate withstand potential characteristics of the select gate transistor. Thus, a potential higher than the read potential, for example, a midpoint potential Vpass (e.g., about 10V) can be used for the precharge potential.

In a second embodiment of the present invention, the use of, for example, the midpoint potential for the precharge potential is explained. In addition, in the present embodiment, the circuit configuration of a NAND flash memory, and the structures of the select gate transistors and the memory cells are similar to those in the first embodiment. Therefore, such a configuration and structures are not described in detail.

(a) Operation

The operation in the present embodiment is explained below with FIGS. 1 and 7.

Figure 7:
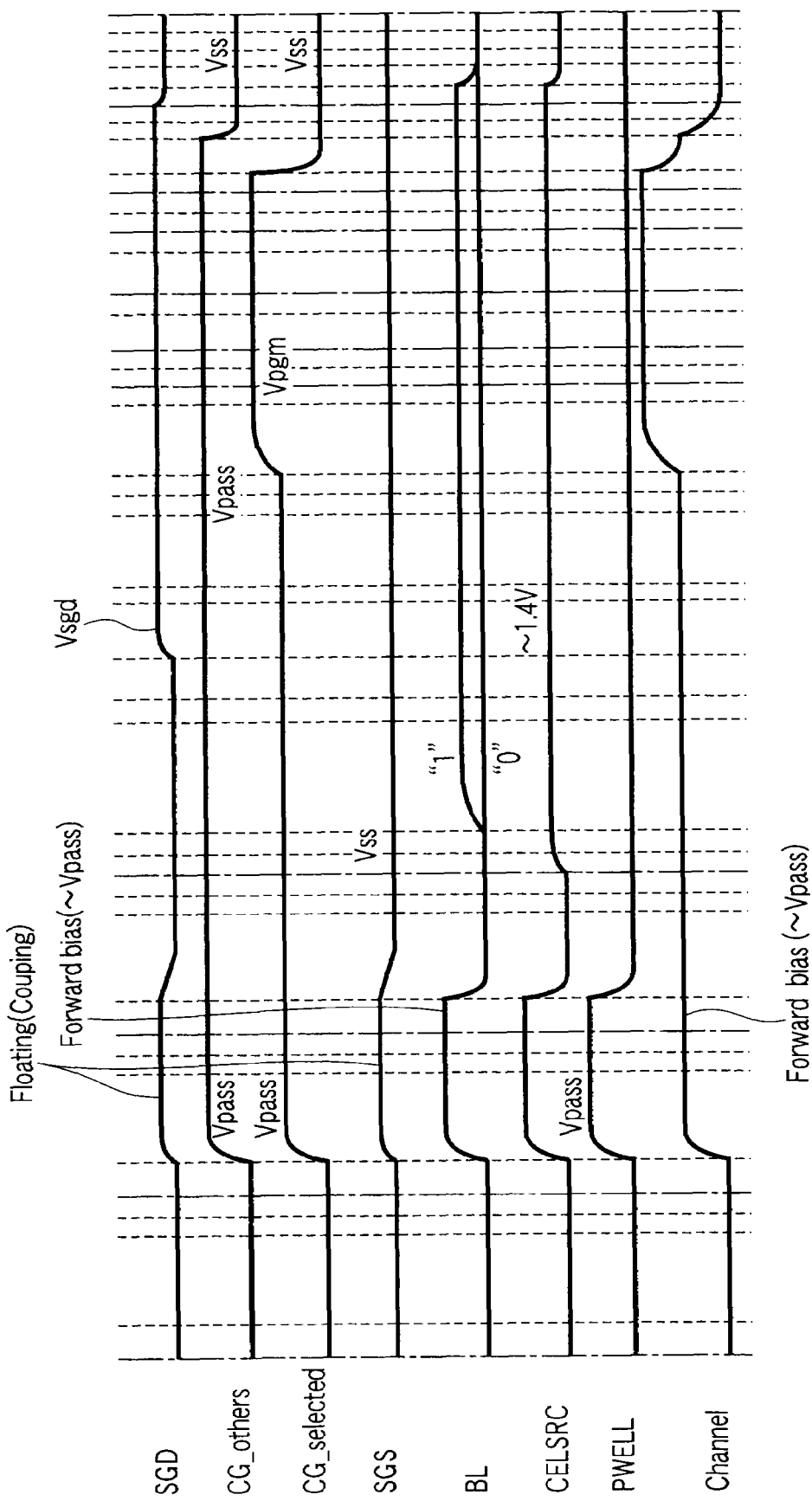
FIG. 7 is a timing chart showing a write operation in a second embodiment.

FIG. 7 is a timing chart showing the operation in the present embodiment.

First, a state machine 4 in FIG. 1 causes a row control circuit 8 to turn off select gate transistors SGD, SGS so that the select gate transistors SGD, SGS float. Thus, even if a high potential such as a midpoint potential Vpass is applied to the channel area of the select gate transistor, the dielectric breakdown of its gate insulating film can be prevented.

Next, as in the operation of the first embodiment, for example, the midpoint potential Vpass (e.g., about 10V) as the precharge potential is applied to a P-well area PWELL. At the same time, for example, the midpoint potential Vpass is applied to a selected word line WL_selected and nonselected word lines WL_Others.

Then, a source/drain diffusion layer of the memory cell is charged to a forward bias potential Vforward (about the midpoint potential Vpass), and as shown in FIG. 7, the potential of a channel area Channel of the memory cell rises to the forward bias potential Vforward.

Then, the potential of the P-well area PWELL is brought to zero. Moreover, the selected word line WL_selected and the nonselected word lines WL_Others are kept at the midpoint potential Vpass.

Therefore, as shown in FIG. 7, the potential of the P-well area PWELL reaches zero. On the other hand, the midpoint potential Vpass is applied to the selected word line WL_selected and the nonselected word lines WL_Others, and an inversion layer is still formed. Therefore, the channel area Channel of the memory cell is kept at the forward bias potential Vforward and precharged with this potential.

The forward bias potential Vforward at this point is a midpoint potential Vpass of about 10V. That is, the channel area Channel can be precharged with a precharge potential equal to or more than a read potential (about 5V) which is the forward bias potential Vforward of the first embodiment.

After the precharging of the channel area, a write operation similar to that in the first embodiment shown in FIGS. 5 and 6 is performed.

For example, a potential of about 1.4V is applied to, for example, a source line CELSRC.

Then, the state machine 4 causes a column control circuit 9 and a sense amplifier 10 to transfer write data. Thus, the potential of the bit line to which a memory cell selected for writing is connected is brought to zero, and the potential of the bit line to which the "1" programming cell is connected rises.

Then, the state machine 4 causes the row control circuit 8 to apply the gate potential Vsgd (e.g., about 4V) to the select gate transistor SGD.

Furthermore, a write potential Vpgm (e.g., about 20V) is applied to the selected word line WL_selected.

As the channel area of the "1" programming cell is boosted up, no erroneous writing occurs. Moreover, the potential of the channel area of the "0" programming cell reaches zero, and an electric field sufficient for writing "0" is applied thereto, so that "0" is programmed.

Subsequently, the potential of the selected word line WL_selected is brought to zero, and then the potentials of the nonselected word lines WL_Others are brought to zero, such that the write operation is completed.

As described above, the channel area of the "1" programming cell is precharged with a potential more than a read potential Vread (e.g., 5V), for example, with the midpoint potential Vpass (e.g., about 10V).

Thus, a precharge can be achieved by a potential higher than the read potential without being affected by the drain side select gate transistor and by the back pattern.

It is therefore possible to further inhibit the erroneous writing to the "1" programming cells.

3. Others

The examples of the present invention can inhibit the erroneous writing to the memory cells.

The examples of the present invention are not limited to the embodiments described above, and modifications of components can be made and embodied without departing from the spirit of the present invention. Moreover, proper combinations of a plurality of components disclosed in the embodiments described above make it possible to create various inventions. For example, some of all the components disclosed in the embodiments described above may be eliminated, or components in different embodiments may be suitably combined.

What is claimed is:

1. A nonvolatile semiconductor memory comprising:
   a plurality of serially connected memory cells arranged on a P-well area within a semiconductor substrate;
   select gate transistors connected to one end and the other end of the serially connected memory cells;
   a P-well control circuit which controls the P-well area;
   a plurality of word lines connected to the plurality of memory cells;
   a row control circuit which controls the plurality of word lines; and
   an operation control circuit which controls the P-well control circuit and the row control circuit,
   wherein, when writing to a selected one of the plurality of memory cells, the operation control circuit controls the P-well control circuit to apply a precharge potential to the P-well area and thus precharge channel areas of the plurality of memory cells.

2. The nonvolatile semiconductor memory according to claim 1, wherein
   the operation control circuit is configured to:
   cause the P-well control circuit and the row control circuit to apply the precharge potential to the P-well area and the plurality of word lines;
   cause the P-well control circuit to stop the application of the precharge potential to the P-well area after the application of the precharge potential; and
   cause the row control circuit to apply a program potential to a selected one of the plurality of word lines after the stopping of the application of the precharge potential.

3. The nonvolatile semiconductor memory according to claim 2, further comprising:
   a bit line connected to a drain of the select gate transistor at the one end of the plurality of memory cells;
   a source line connected to a source of the select gate transistor at the other end of the plurality of memory cells;
   select gate lines connected to gates of the select gate transistors and controlled by the row control circuit;
   a column control circuit which controls the bit line; and
   a source line control circuit which controls the source line.

4. The nonvolatile semiconductor memory according to claim 3, wherein
   the operation control circuit is further configured to:
   cause the source line control circuit to apply a potential to the source line before the application of the program potential to the selected word line;

cause the column control circuit to transfer data to the bit line;

cause the row control circuit to apply a potential to the select gate line of the select gate transistor to which the bit line is connected; and cause the row control circuit to apply a potential lower than the program potential to a nonselected one of the plurality of word lines.

5. The nonvolatile semiconductor memory according to claim 1, wherein the thickness of gate insulating films provided in the select gate transistors is the same as the thickness of gate insulating films provided in the plurality of memory cells.

6. The nonvolatile semiconductor memory according to claim 2, wherein the precharge potential is equal to or more than a read potential and lower than the program potential.

7. The nonvolatile semiconductor memory according to claim 6, wherein the read potential is 5V.

8. The nonvolatile semiconductor memory according to claim 6, wherein the program potential is 20V.

9. A nonvolatile semiconductor memory comprising:

a plurality of serially connected memory cells arranged on a P-well area within a semiconductor substrate;

select gate transistors connected to one end and the other end of the serially connected memory cells;

a P-well control circuit which controls the P-well area;

a plurality of word lines connected to the plurality of memory cells;

a row control circuit which controls the plurality of word lines; and an operation control circuit which controls the P-well control circuit and the row control circuit, wherein, when writing to a selected one of the plurality of memory cells, the operation control circuit controls the row control circuit to bring the select gate transistors at the one end and the other end into a floating state, and the operation control circuit then controls the P-well control circuit to apply a precharge potential to the P-well area and thus precharge channel areas of the plurality of memory cells.

10. The nonvolatile semiconductor memory according to claim 9, wherein the operation control circuit is configured to:

cause the P-well control circuit and the row control circuit to apply the precharge potential to the P-well area and the plurality of word lines;

cause the P-well control circuit to stop the application of the precharge potential to the P-well area after the application of the precharge potential; and cause the row control circuit to apply a program potential to a selected one of the plurality of word lines after the stopping of the application of the precharge potential.

11. The nonvolatile semiconductor memory according to claim 10, further comprising:

a bit line connected to a drain of the select gate transistor at the one end of the plurality of memory cells;

a source line connected to a source of the select gate transistor at the other end of the plurality of memory cells;

select gate lines connected to gates of the select gate transistors and controlled by the row control circuit;

a column control circuit which controls the bit line; and a source line control circuit which controls the source line.

12. The nonvolatile semiconductor memory according to claim 11, wherein the operation control circuit is further configured to:

cause the source line control circuit to apply a potential to the source line before applying the program potential to the selected word line;

cause the column control circuit to transfer data to the bit line;

cause the row control circuit to apply a potential to the select gate line of the select gate transistor to which the bit line is connected; and cause the row control circuit to apply a potential lower than the program potential to a nonselected one of the plurality of word lines.

13. The nonvolatile semiconductor memory according to claim 9, wherein the thickness of gate insulating films provided in the select gate transistors is the same as the thickness of gate insulating films provided in the plurality of memory cells.

14. The nonvolatile semiconductor memory according to claim 9, wherein the precharge potential is equal to or more than a read potential and lower than a write potential.

15. The nonvolatile semiconductor memory according to claim 14, wherein the read potential is 5V.

16. The nonvolatile semiconductor memory according to claim 14, wherein the write potential is 20V.

17. A driving method of a nonvolatile semiconductor memory comprising:

applying a precharge potential to a P-well area within a semiconductor substrate in which a plurality of memory cells are provided;

applying a potential to a plurality of word lines connected to the plurality of memory cells;

stopping the application of the precharge potential to the P-well area after the application of the potential to the plurality of word lines; and applying a program potential to a selected one of the plurality of word lines after stopping the application of the precharge potential.

18. The driving method of a nonvolatile semiconductor memory according to claim 17, further comprising:

bringing the first and second select gate transistors connected to the one end and the other end of the plurality of memory cells into a floating state before applying the precharge potential to the P-well area.

19. The driving method of a nonvolatile semiconductor memory according to claim 18, further comprising:

applying a potential to a source line connected to a source of the first select gate transistor, before applying the program potential to the selected word line;

transferring data to a bit line connected to a drain of the second select gate transistor;

applying a potential to a select gate line of the second select gate transistor to which the bit line is connected; and applying a potential lower than the program potential to a nonselected one of the plurality of word lines.

20. The driving method of a nonvolatile semiconductor memory according to claim 17, wherein the precharge potential is equal to or more than a read potential and lower than the program potential.

* * * * *